United States Patent
Tai et al.

(10) Patent No.: US 10,204,693 B2
(45) Date of Patent: Feb. 12, 2019

(54) RETIRING COMPUTER MEMORY BLOCKS

(71) Applicant: Western Digital Technologies, Inc., San Jose, CA (US)

(72) Inventors: Ming-Yu Tai, Irvine, CA (US); Yun-Tzuo Lai, Irvine, CA (US); Yung-Li Ji, Santa Ana, CA (US); Haining Liu, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 65 days.

(21) Appl. No.: 15/396,547

(22) Filed: Dec. 31, 2016

(65) Prior Publication Data

US 2018/0188984 A1    Jul. 5, 2018

(51) Int. Cl.
*G11C 16/34* (2006.01)
*G06F 12/02* (2006.01)
*G06F 3/06* (2006.01)
*G06F 11/07* (2006.01)

(52) U.S. Cl.
CPC ........ *G11C 16/3495* (2013.01); *G06F 3/0619* (2013.01); *G06F 3/0655* (2013.01); *G06F 3/0688* (2013.01); *G06F 11/076* (2013.01); *G06F 12/02* (2013.01); *G06F 12/0246* (2013.01); *G06F 12/0253* (2013.01); *G11C 16/349* (2013.01); *G06F 2212/1036* (2013.01); *G06F 2212/1044* (2013.01); *G06F 2212/7211* (2013.01)

(58) Field of Classification Search
CPC .............. G11C 16/3495; G11C 16/349; G06F 12/0253; G06F 12/0246; G06F 2212/1036
See application file for complete search history.

(56) References Cited

U.S. PATENT DOCUMENTS

| 5,485,595 | A | 1/1996 | Assar et al. | |
|---|---|---|---|---|
| 6,000,006 | A | 12/1999 | Bruce et al. | |
| 7,093,190 | B1 * | 8/2006 | Kuslak | G06F 11/1032 714/48 |
| 7,412,575 | B2 * | 8/2008 | Park | G06F 11/1048 711/103 |
| 7,979,737 | B2 * | 7/2011 | Lin | G06F 11/1068 714/6.13 |

(Continued)

OTHER PUBLICATIONS

Brian Dipert & Markus Levy; "Desingin with Flash Memory"; Annabooks, San Diego; 1994; pp. 38-44, 65-67, 227-271.

*Primary Examiner* — Joseph D Torres
(74) *Attorney, Agent, or Firm* — Patterson & Sheridan, LLP; Steven Versteeg

(57) ABSTRACT

A method, system, and apparatus are provided for retiring computer memory blocks. Two overall schemes are provided for separating poorly functioning blocks from normally functioning blocks. In a first scheme, after data relocation is finished, firmware remembers the old physical memory block. As soon as the system writes to the old physical memory block with new data, firmware issues a read again and receives back a count of error bits. If the returned error bits are still high, then the system identifies the block as being weak and retires the block. In a second scheme, firmware tracks statistics for data relocates, block reads, activity timers, among other statistics. If some blocks have abnormal activities (e.g., too many data relocates, too many reads, etc.), then the system may identify the block as being weak and may retire the physical memory block.

16 Claims, 8 Drawing Sheets

(56) References Cited

U.S. PATENT DOCUMENTS

| | | | | |
|---|---|---|---|---|
| 8,370,712 B2* | 2/2013 | Eleftheriou | ......... | G06F 11/1068 365/185.3 |
| 9,639,463 B1* | 5/2017 | Kankani | ............. | G06F 12/0261 |
| 2005/0135165 A1* | 6/2005 | Smith | ................. | G06F 11/1008 365/200 |
| 2006/0072157 A1* | 4/2006 | Hodder | ............... | G06F 11/1068 358/1.16 |
| 2008/0307270 A1* | 12/2008 | Li | ......................... | G06F 11/073 714/47.2 |
| 2008/0316822 A1* | 12/2008 | Ahn | ................... | G06F 11/1068 365/185.09 |
| 2009/0034328 A1* | 2/2009 | Seol | .................. | G11C 16/3418 365/185.02 |
| 2010/0058119 A1* | 3/2010 | Reid | ................... | G06F 11/1068 714/49 |
| 2010/0077266 A1* | 3/2010 | Kanno | ................ | G06F 11/1068 714/704 |
| 2010/0306580 A1* | 12/2010 | McKean | ............ | G06F 12/0246 714/6.13 |
| 2011/0051523 A1* | 3/2011 | Manabe | ................ | G11C 16/349 365/185.22 |
| 2013/0073786 A1* | 3/2013 | Belgal | ................ | G06F 12/0246 711/103 |
| 2014/0059405 A1* | 2/2014 | Syu | ..................... | G11C 16/349 714/773 |
| 2014/0237165 A1* | 8/2014 | Seo | ..................... | G06F 12/0246 711/103 |
| 2015/0287478 A1* | 10/2015 | Chen | ...................... | G11C 29/26 714/719 |

* cited by examiner

RETIRING COMPUTER MEMORY BLOCKS

FIELD

The embodiments of the disclosure relate generally to retiring computer memory blocks in a memory apparatus of a computer system.

BACKGROUND

A non-volatile memory device (e.g., a solid state drive, a flash memory integrated circuit device, and the like) is organized as sets of read-writable pages along a plurality of word lines. Each page in a non-volatile memory device includes a plurality of electrically erasable programmable read only memory cells, also referred to as read-writeable non-volatile memory. There are multiple read-writeable pages of non-volatile memory grouped into each word line of a non-volatile memory device. In some cases, a memory block includes about 256 read-writeable pages.

SUMMARY

Aspects of embodiments of the disclosure are summarized by the claims that follow below. In general, the disclosed embodiments provide schemes for retiring a computer memory block when the block is no longer properly storing data.

DETAILED DESCRIPTION

In the following detailed description of the embodiments, numerous specific details are set forth in order to provide a thorough understanding of the embodiments of the disclosure. However, it will be obvious to one skilled in the art that the embodiments of the disclosure may be practiced without these specific details. In other instances well known methods, procedures, components, and circuits have not been described in detail so as not to unnecessarily obscure aspects of the embodiments of the disclosure.

Non-volatile memory integrated circuits possess characteristics that allow them to augment, and in some cases replace dynamic random access memory (DRAM) and storage disks in a storage subsystem of a computer system. Some types of non-volatile memory circuits, such as NAND Flash integrated circuits, can be configured as storage devices that offer disk-like non-volatility and capacity, with DRAM-like read and write access performance. Delivering the same performance, some types of non-volatile memory circuits may utilize less space and consume less power.

Non-volatile memory circuits can be manufactured into a hardware device for use with a host computer system. One example of such a hardware device is a flash drive. Reliability is important in a non-volatile memory device. Important user data is often written into non-volatile memory devices. Users have expectations that data previously written into a non-volatile memory device can be reliably written to and read out from the device, even after a planned or unplanned loss of power, and even after extended use over a period of time.

Figure 1:
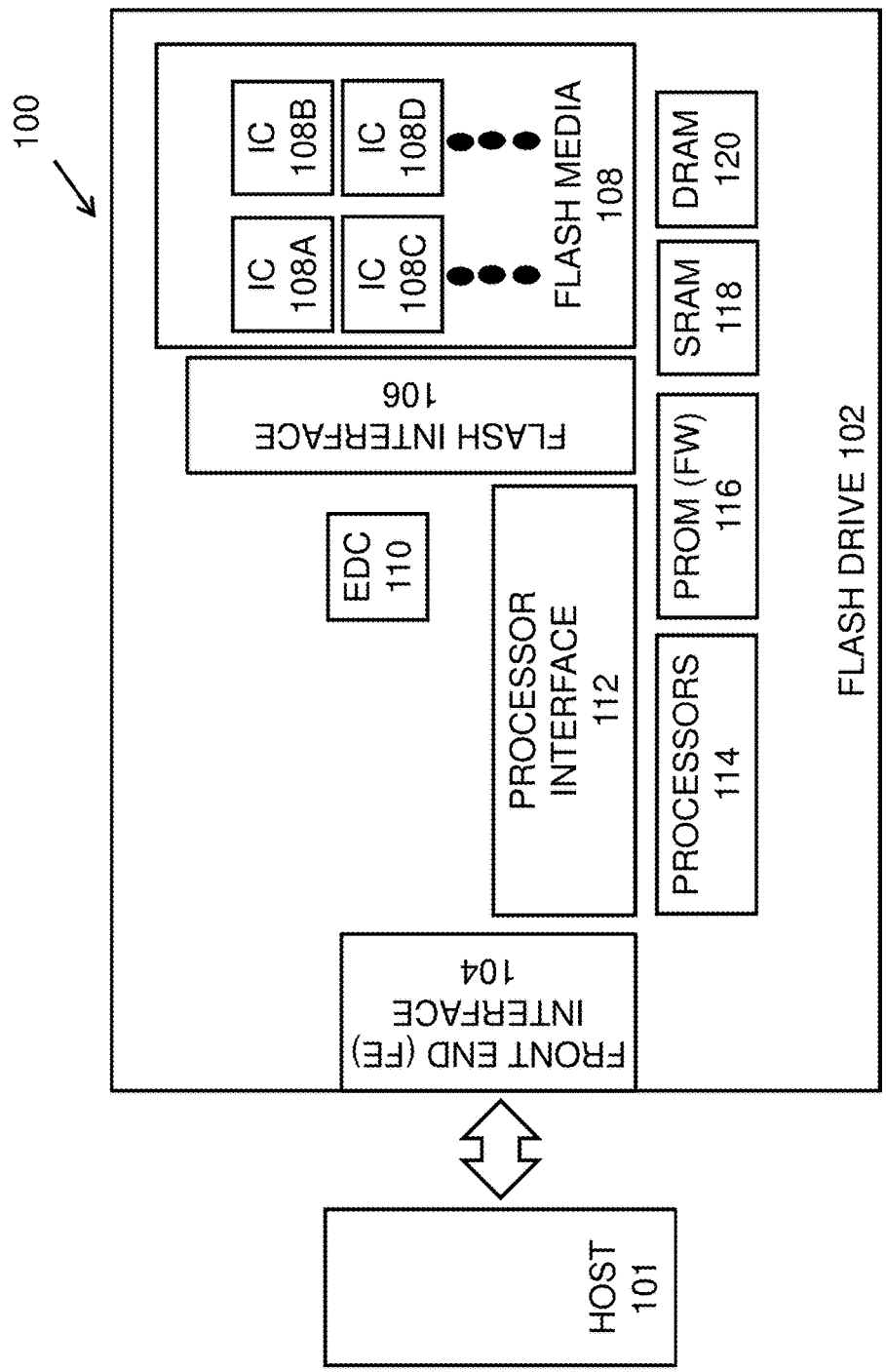
FIG. 1 is a conceptual block diagram of a host computer operationally coupled to a flash memory drive.

FIG. 1 illustrates such a computer system 100 having a host computer 101 operationally coupled to a flash drive 102. As shown in this figure, the flash drive 102 includes a front end (FE) interface 104 for coupling to the host computer 101 and receiving read and write requests from the host computer 101. One of ordinary skill recognizes a variety of implementations and protocols for the front end interface 104 such as, for example, serial advanced technology attachment (SATA), non-volatile memory express (NVMe), small computer system interface (SCSI), and serially attached SCSI (SAS), among others. The flash drive 102 also includes flash media 108 having a plurality of flash memory integrated circuits (ICs or chips) 108A, 108B, 108C, and 108D, and so on.

The flash memory chips 108A, 108B, 108C and 108D include physical memory blocks that are typically organized into a set of read/writeable logical memory blocks that are used to store data for the host computer 101. The flash media 108 is implemented by using NAND-type flash memory cells, NOR-type flash memory cells, or another type of suitable electrically erasable programmable read only memory cells for implementing the flash media 108 in an integrated circuit. One of ordinary skill recognizes that the exemplary flash memory chips 108A, 108B, 108C and 108D are illustrative of implementations that include small and/or large numbers of chips of various numbers of transistors and memory cells such as, for example, up to terabyte capacities or above.

To write data efficiently, the flash memory chips in the flash media 108 are erased at a granularity of a data block. A data block is a sequence of memory cells addressable together having a block size of storage capacity of data bits. The size of a data block can vary depending upon the type of flash memory (e.g., NAND flash memory or NOR flash memory) and the semiconductor manufacturing geometries available to make the flash memory cells. For example, in one flash memory device one data block can be 4 kilobytes with 8 pages of 512 bytes. In another more dense flash memory device, one data block can be 4 megabytes with 256 pages of 16 kilobytes. One byte of data is typically defined to be 8 bits of data.

After erasing a data block, data can be written at the granularity of the data block or a smaller granularity, such as a page within the data block. Data can be read out from the flash memory chips in the flash media 108 by the data block, the page, or at an even smaller granularity of the data block such as a byte, for example.

Within the host 101, application software and/or operating system software may be executed by one or more processors and issue block memory access requests to driver software to read or write blocks of data within main memory. The driver software may aggregate a number of block memory access requests from application software and/or operating system software into sets of one or more block memory access requests against master memory controllers.

The application or operating system software includes instructions that when executed by a processor issues block memory access requests. The driver software includes instructions that when executed by a processor provide an operations scheduler to receive the block memory access requests. The driver software issues read, write, and erase operations to the flash media 108 coupled to memory channels in response to the block memory access requests. The operation of the driver software to schedule read and write operations is in part responsive to the application software or operating system making block memory access requests.

The flash drive 102 further includes one or more processors 114 for processing the write requests by using the flash media 108, static random access memory (SRAM) 118, dynamic random access memory (DRAM) 120, an error detect and correct (EDC) module 110, and firmware 116. The firmware 116 is implemented in one or more forms of programmable read only memory (PROM) such as erasable programmable read only memory (EPROM) and/or electrically erasable programmable read only memory (EEPROM), as examples.

The firmware 116 can store instructions for the processors 114 such that when coupled to the host 101, the flash drive 102 can determine if a physical memory block is to be retired. One of ordinary skill recognizes that the flash drive 102 is representative of a variety of hardware devices that may incorporate the embodiments disclosed herein, and that reliability is important to the system 100.

In order to avoid data lose, solid-state drive (SSD) firmware performs a background media scan to detect read disturb (RD)/data retention (DR) blocks. If the scanned blocks return a high bit error rate (BER), one or more memory blocks of data are relocated (e.g., moved) to another physical memory block. In some cases, a few blocks may each return a high bit error rate even though each block has not suffered from a read disturb or a data retention error. The high bit error rate may be due to one or more cell imperfections during the manufacturing process. These types of memory blocks will likely always return a high bit error rate, no matter what. Relocation will, consequently, be triggered again and again. As a result, wear-leveling (e.g., level of wear of memory block) and performance quality of service (Qos) will be impacted.

In order to solve these problems, firmware 116 is configured to detect and retire these problematic memory blocks (e.g., weak memory blocks with high bit error rate and/or memory blocks with other problems).

System and Apparatus for Retiring Memory Blocks

Two overall schemes are provided for separating the poorly functioning blocks (e.g., weak memory blocks with high bit error rate and/or memory blocks with other problems) from normally functioning blocks. In a first scheme, after data relocation is finished, firmware 116 remembers the old physical memory block. As soon as the system writes to the old physical memory block with new data, firmware 116 issues a read again and receives back a count of error bits. If the returned error bits are still high (e.g., high bit error rate), then the flash drive 102 identifies the block as being weak and retires the block. In a second scheme, firmware 116 tracks statistics for data relocates, block reads, activity timers, among other statistics. If some blocks have abnormal activities (e.g., too many data relocates, too many data reads, etc.), then the flash drive 102 may identify the block as being weak and may retire the physical memory block.

Referring again to FIG. 1, an example block retirement is described. The flash drive 102 receives a read request from a processor in the host computer 101. A read request can be made on (e.g., directed toward) a page of a block of memory. For comparison, writes and erases are typically performed in blocks of memory. The flash drive 102 is configured to retrieve data from the flash media 108 and return the data to the host computer 101 via the front end interface 104.

The flash interface 106 collects and/or corrects error bits in one or more memory blocks in the flash media 108. A memory block may be included one or more ICs in the flash media 108. Each memory block may include, for example, NAND gates. A memory block typically includes at least a portion (e.g., set of NAND gates) of one IC in the flash media 108.

Via the flash memory interface 106, the one or more processors 114 may occasionally perform a background scan of one or more memory blocks in the flash media 108. The background scan may be referred to as a read disturb detect. The one or more processors 114 receive a count of error bits (e.g., bit error rate) for each memory block in the flash media 108 via the flash interface 106. The one or more processors 114 check for codes associated with the memory blocks in the flash media 108. An example code is error bits associated with a memory block in the flash media 108. The code for bit error rate and other such important statistics (e.g., number of block relocates, number or block reads, etc.) may be stored in firmware 116. A block life time (e.g., last time data in block was moved) may be stored in DRAM 120. The block lifetime is typically irrelevant after a power off.

Figure 2:
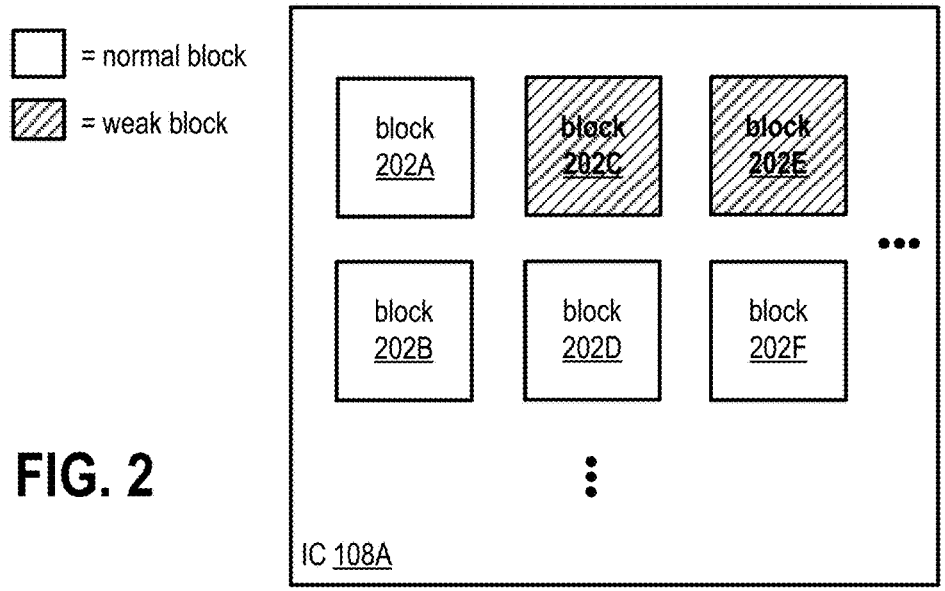
FIG. 2 is a conceptual block diagram of results of a background scan (e.g., read disturb detect) of the flash media.

FIG. 2 is a conceptual block diagram of results of a background scan (e.g., read disturb detect) of the flash media 108. For simplicity, FIG. 2 shows IC 108A and not the other ICs of the flash media 108. However, the invention is not so limited. The background scan spans over a plurality of physical memory blocks in a plurality of integrated circuits (e.g., IC 108A-108F, etc.).

The one or more processors 114 have identified, for example, block 202C and block 202E as each having a high number of error bits (e.g., high bit error rate). Accordingly, the flash drive 102 considers block 202C and block 202E to be weak physical memory blocks in this example. The one or more processors 114 relocate (e.g., move) the data in weak physical memory blocks (e.g., block 202C and block 202E) to one or more other physical memory blocks. For instance, the one or more processors 114 may move data from block 202C to block 202F, and may move data from block 202E to blocks block 202A and 202B. Also, as further described with reference to FIG. 3, the one or more processors 114 update the bookkeeping for the flash media 108 by moving each weak physical memory block (e.g., block 202C and block 202E) from a "normal" list to a "retired" list.

Figure 3:
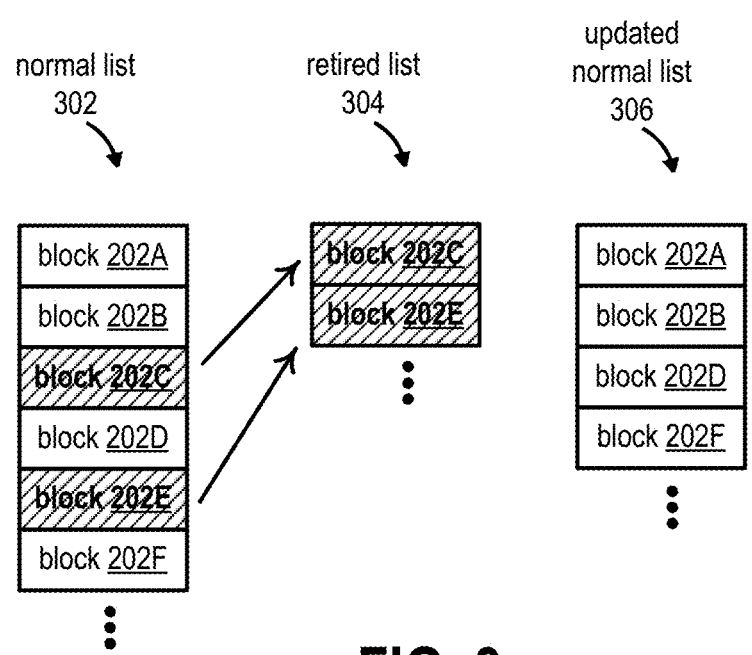
FIG. 3 is a conceptual block diagram of bookkeeping for memory blocks.

FIG. 3 is a conceptual block diagram of bookkeeping for physical memory blocks. For explanatory purposes, FIG. 3 shows a normal list 302, a retired list 304, and an updated normal list 306. However, the lists for bookkeeping are not limited to specific configuration shown in FIG. 3.

The normal list 302, the retired list 304, and the updated normal list 306 each include, for example, a linked list of pointers. Each pointer points to a memory block (e.g., pointer to address of a memory block in flash media 108). The flash drive 102 stores the normal list 302, the retired list 304, and the updated normal list 306 in DRAM 120. The flash drive 102 can additionally, or alternative, store the lists somewhere else (e.g., non-volatile backup, shadow RAM, etc.) for shutdown, power outage, or another situation that may require backup.

The flash drive 102 keeps track of normal-functioning physical memory blocks in the normal list 302. For example, the flash drive 102 stores, in the normal list 302, a pointer to each normal-functioning physical memory block (e.g., pointer to address of memory block in flash media 108). In the example of FIG. 3, the normal list 302 initially includes pointers for blocks 202A-202F, among other blocks.

The flash drive 102 keeps track of weak physical memory blocks in the retired list 304. For example, in the retired list 304, the flash drive 102 stores a pointer to each weak physical memory block (e.g., pointer to an address for each weak memory block). In the example of FIG. 3, the retired list 304 includes pointers for block 202C and block 202E, among other blocks.

If the flash drive 102 determines a memory block is a weak block or otherwise problematic, then the flash drive 102 relocates (e.g., moves) the pointer for that memory block from the normal list 302 to the retired list 304. For example, the flash drive 102 determines memory blocks block 202C and block 202E are weak blocks or otherwise problematic; the flash drive 102 then moves the pointers for block 202C and block 202E to the retired list 304.

The normal list 302 is thereby updated to be the updated normal list 306, which is then the current normal list for the flash drive 102. In the example of FIG. 3, the updated normal list 306 includes block 202A, block 202B, block 202D, and block 202F, among other blocks.

The flash drive 102 is configured not to use blocks in the retired list 304 again. For example, the flash drive 102 may not issue a write/read/erase command to any physical memory block in the retired list 304 (e.g., block 202C, block 202E, etc.).

Accordingly, the flash drive 102 can detect a weak block or otherwise problematic block, relocate that block's data, and immediately retire the physical memory block during run-time. Continuous data relocation does not affect static wear-leveling of the physical memory blocks. Continuous relocation of blocks helps improves quality of service (QoS) performance.

Methods for Retiring Memory Blocks

Two overall methods for retiring memory blocks include the following: (1) identifying memory blocks having a high bit error rate (BER) and (2) tracking data relocation statistics, read statistics, and/or power-on timing statistics. Details of these overall methods for retiring memory blocks are described with reference to FIGS. 4-7, among other figures.

Figure 4:
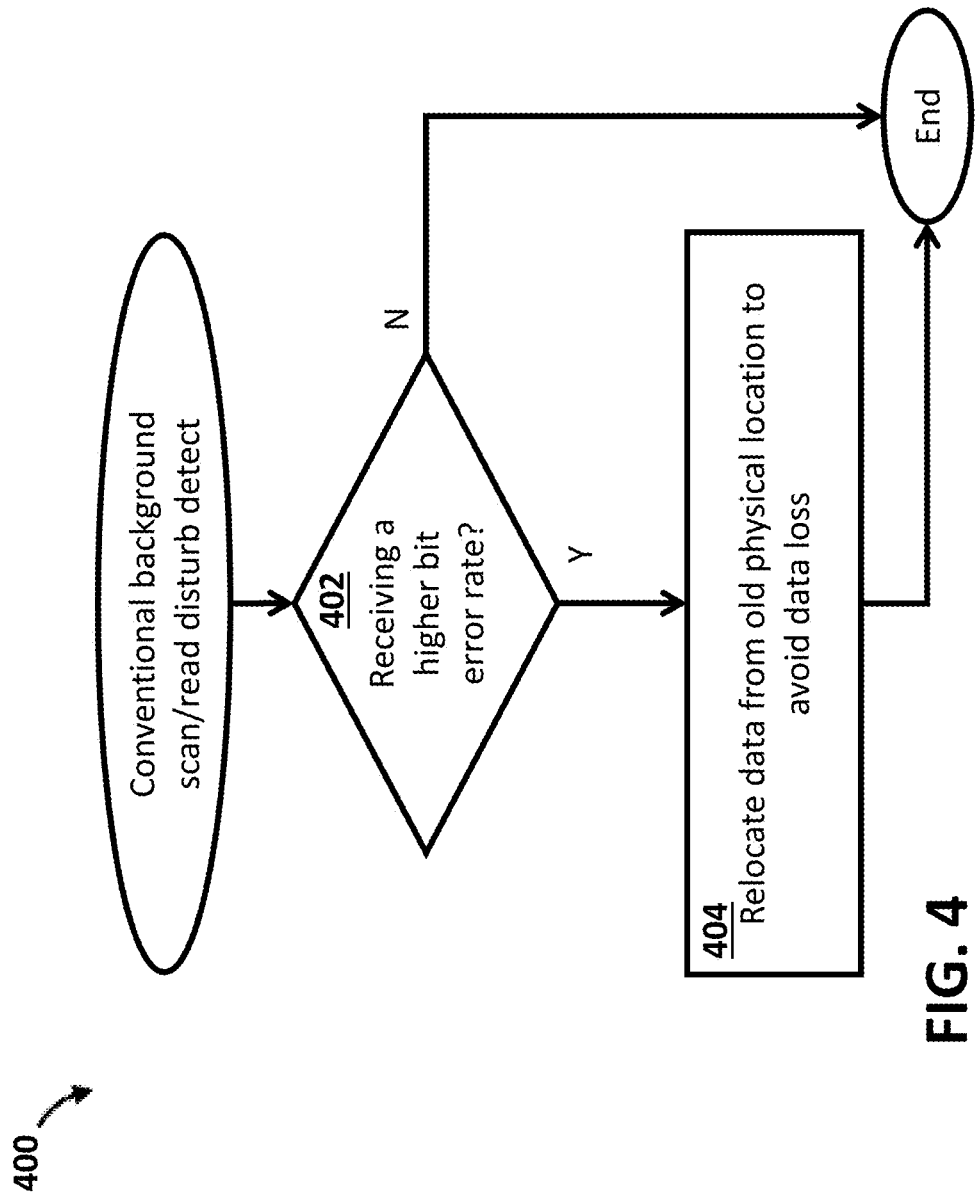
FIG. 4 is a flowchart of a conventional method for performing a background scan of memory blocks.

FIG. 4 is a flowchart of a conventional method 400 for performing a background scan of memory blocks. The conventional background scan may also be referred to as a conventional read disturb detect. At decision 402, a conventional system determines a high bit error rate is received from a memory block. For example, a high bit error rate may be (1) a bit error rate that is over an acceptability threshold or (2) a bit error rate that is higher than a previously received bit error rate for that block.

If no at decision 402, then the method 400 is at an end. However, if yes at decision 402, then the method 400 moves to action 404 where the conventional system relocates data from the old physical memory block in order to avoid data loss. The conventional system may reuse that physical memory block for future write/read/erase operations. Unfortunately, reusing that physical memory block may be problematic because the physical memory block is likely to be unreliable for storing data.

Figure 5:
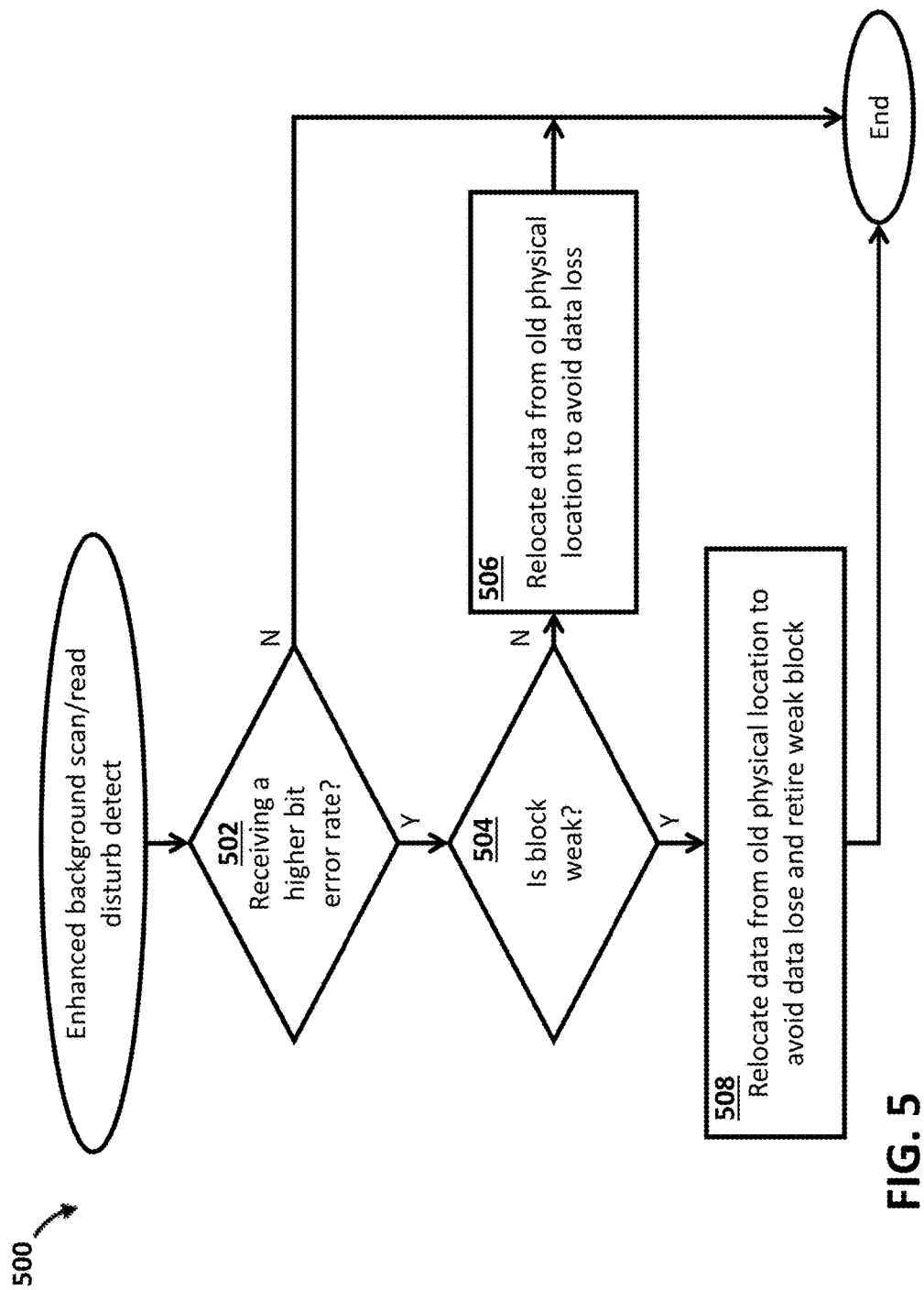
FIG. 5 is a flowchart of a method for performing an enhanced background scan of memory blocks.

FIG. 5 is a flowchart of a method 500 for performing an enhanced background scan of memory blocks in the flash media 108. In some embodiments, the method 500 may be carried out by the flash drive 102 of FIG. 1. The background scan of FIG. 5 may also be referred to as a read disturb detect. The background scan of method 500 is part of the first scheme for determining if a memory block is to be retired.

At decision 502, the flash drive 102 determines if a high bit error rate is received from a block. For example, a high bit error rate may be (1) a bit error rate that is over an acceptability threshold or (2) a bit error rate that is higher than the previously received bit error rate. If only a few pages of a block are malfunctioning, then the flash drive 102 may erase the block and rewrite to the block. However, the flash drive 102 typically does not keep track of individual pages within blocks because there is typically insufficient memory to keep track of individual pages.

If no at decision 502 (e.g., bit error rate is not high), then the method 500 is at an end but may be repeated as necessary. However, if yes at decision 502 (e.g., bit error rate is high), then the method 500 moves to decision 504.

At decision 504, the flash drive 102 determines if the block in question is a weak block. A weak block may be identified, for example, by (1) a bit error rate being above an acceptability threshold and/or (2) timing of data retention in the memory block being below an acceptability threshold.

An acceptability threshold for a bit error rate is, for example, one hundred bits in error per four kilobytes. Another acceptability threshold is a block having over one-third of pages that are weak. An acceptability threshold for timing of data retention is, for example, ten days (as opposed to one year for example). These acceptability thresholds are provided for explanatory purposes. However, the invention is not so limited. Any other acceptability threshold may be included in another embodiment.

If no at decision 504 (e.g., block is not weak), then the method 500 moves to action 506. At action 506, the flash drive 102 relocates the data in the old physical memory block to a new physical memory block, in order to avoid data loss. However, the old physical memory block is not retired.

However, if yes at decision 504 (e.g., block is weak), then the method 500 moves to action 508 where the flash drive 102 relocates data from the old physical memory block to a new physical memory block. The flash drive 102 also retires the old physical memory block (e.g., weak memory block), in order to avoid data loss. The flash drive 102 does not make the weak block available again (e.g., no future write, read, and/or erase operations are performed). Referring again to FIGS. 2 and 3, the flash drive 102 can move a block from a normal list 302 to a retired list 304; the flash drive 102 makes the blocks in the retired list 304 unavailable.

Figure 6:
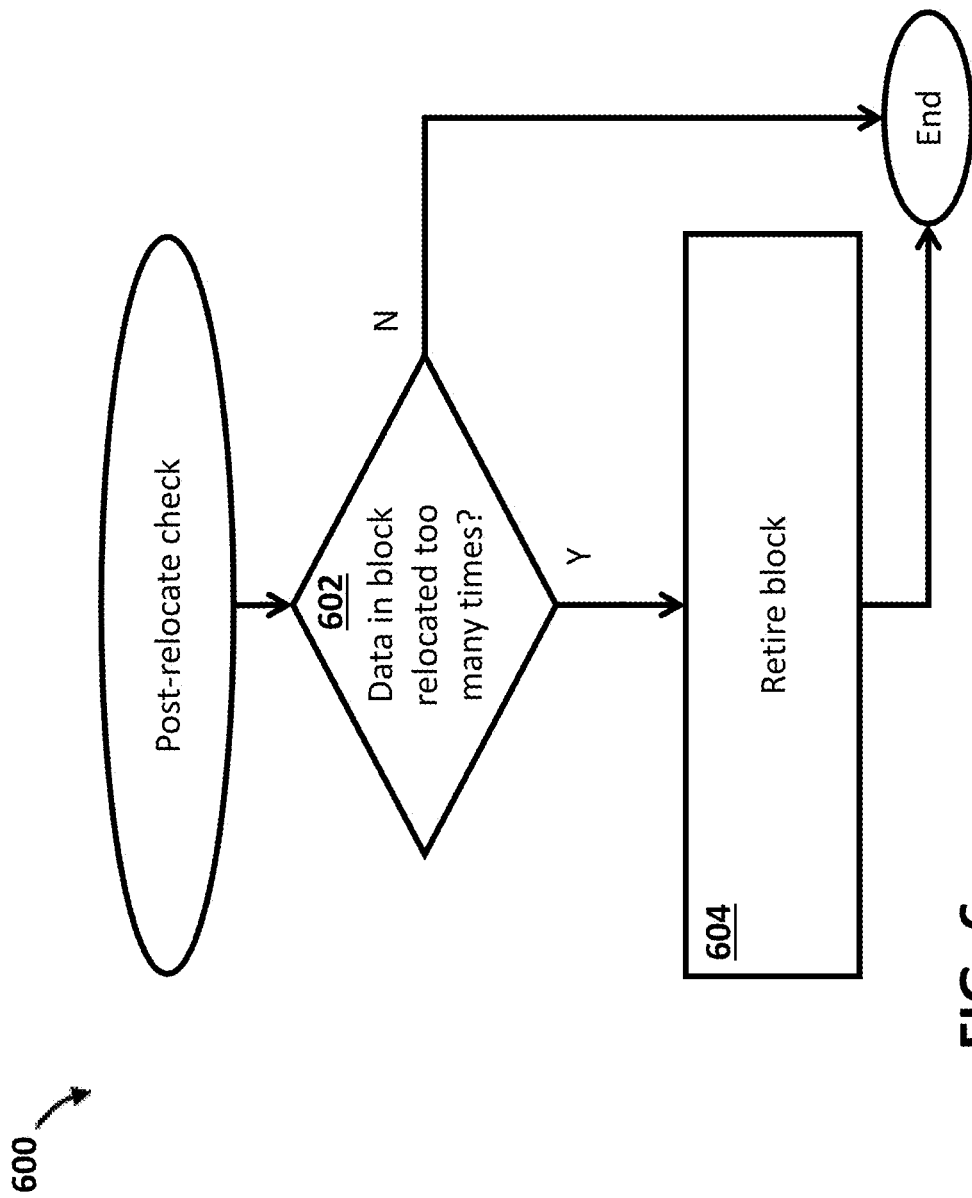
FIG. 6 is a flowchart of a method for performing a post-relocate check on a memory block.

FIG. 6 is a flowchart of a method 600 for performing a post-relocate check on a memory block in the flash media 108. In some embodiments, the method 600 may be carried out by the flash drive 102 of FIG. 1. The post-relocate check is part of the secondary scheme for determining if a memory block is to be retired. The context of method 600 is after the flash drive 102 has relocated a block of data to another physical memory block but has not yet retired the old physical memory block (e.g., context is after action 506 of FIG. 5).

At decision 602, the flash drive 102 determines if data has been relocated too many times from a particular physical memory block. For example, the flash drive 102 calculates a number of data relocates that have occurred from the physical memory block. The flash drive 102 determines if the number of data relocates is over an acceptability threshold for data relocates.

An acceptability threshold for a number of relocates is, for example, two relocates from a physical memory block. This acceptability threshold is provided for explanatory purposes. However, the invention is not so limited. Any other acceptability threshold may be included in another embodiment.

If no at decision 602 (e.g., data has not been relocated too many times), then the method 600 is at an end but may repeat as necessary.

However, if yes at decision 602 (e.g., data has been relocated too many times), then the method 600 moves to action 604.

At action 604, the flash drive 102 identifies the block as being problematic (e.g., weak block) and retires the block (e.g., retires the particular physical memory block).

Figure 7:
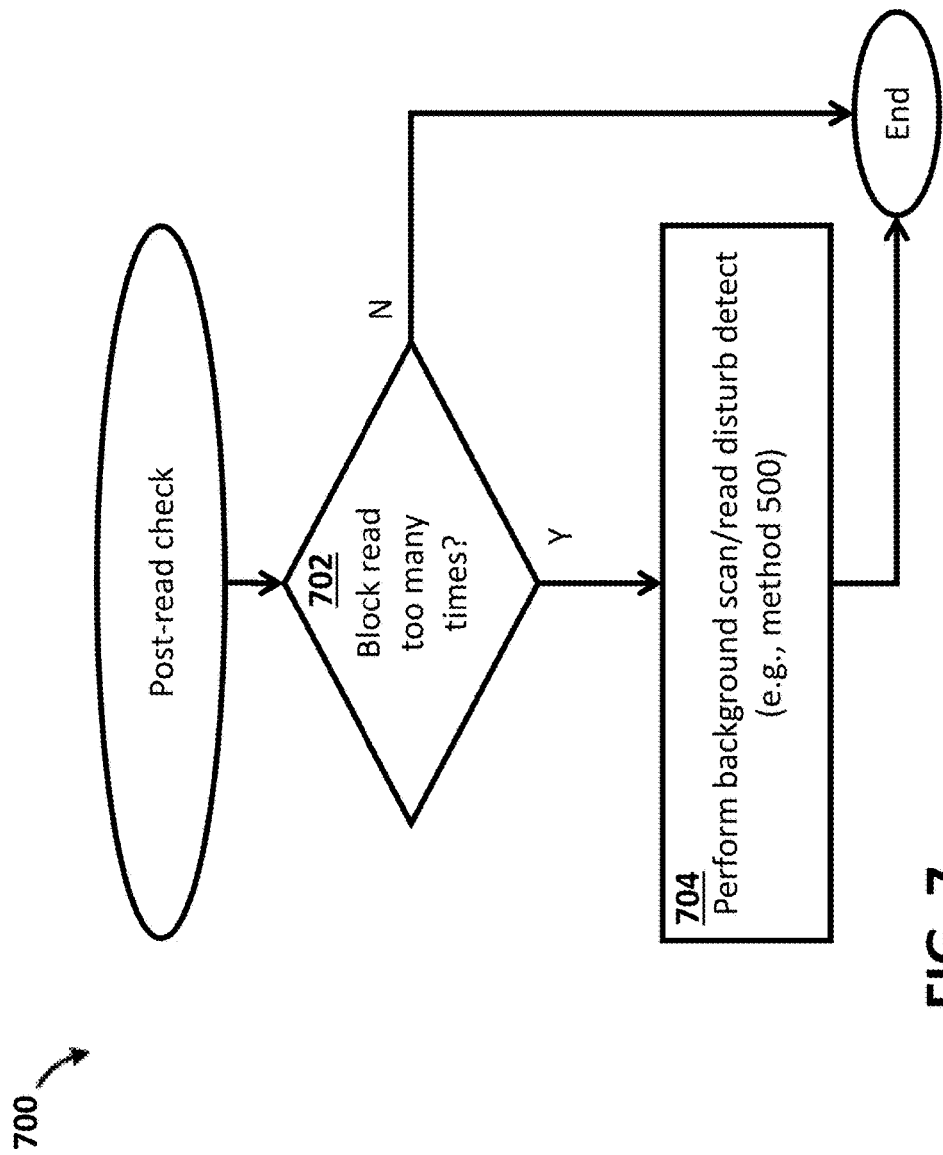
FIG. 7 is a flowchart of a method for performing a post-read check on a memory block.

FIG. 7 is a flowchart of a method 700 for performing a post-read check on a memory block in the flash media 108. In some embodiments, the method 700 may be carried out by the flash drive 102 of FIG. 1. The post-read check of method 700 is part of the secondary scheme for determining if a memory block is to be retired. A read request can be performed on a page of a block of memory in the flash media 108. For comparison, writes and erases are typically performed on blocks of memory in the flash media 108.

At decision 702, the flash drive 102 determines if a particular memory block has been read too many times. For example, the flash drive 102 calculates a number of reads that have occurred from the physical memory block. The flash drive determines if the number of reads of data at a physical memory block is over an acceptability threshold for a number of reads. The flash drive 102 may read a block too many times if, for example, the block has physical problems with pages in the block. Too many reads tend to occur near an end of life (e.g., end of "shelf life") for the block. Near an end of life for a block, unintentional erases may keep happening, which tends to generate a high page error count.

An acceptability threshold for the number of reads may be, for example, five thousand reads from a memory block in the flash media 108. This acceptability threshold is provided for explanatory purposes. However, the invention is not so limited. Any other acceptability threshold may be included in another embodiment.

In one embodiment, the flash drive 102 maintains a global counter for all blocks in flash media 108. Once the global counter reaches the acceptability threshold for reads, then the flash drive 102 may perform decision 702.

If no at decision 702 (e.g., block has not been read too many times), then the method 700 is at an end but may repeat as necessary.

However, if yes at decision 702 (e.g., block has been read too many times), then the method 700 moves to action 704.

At action 704, the flash drive performs the background scan operations of method 500 of FIG. 5.

Figure 8:
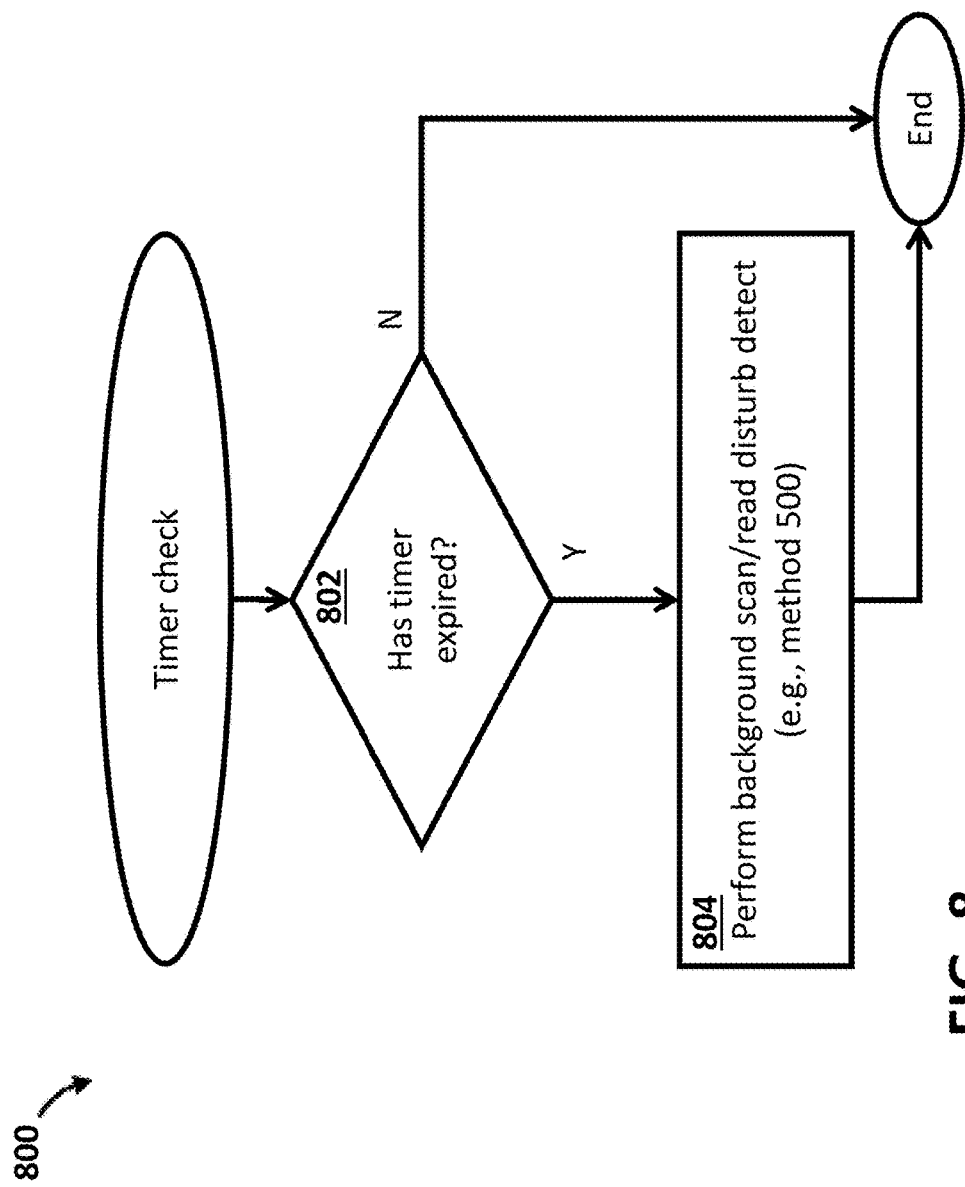
FIG. 8 is a flowchart of a method for performing a timer check on memory blocks in the flash media.

FIG. 8 is a flowchart of a method 800 for performing a timer check on memory blocks in the flash media 108. In some embodiments, the method 800 may be carried out by the flash drive 102 of FIG. 1. The timer check of method 800 is part of the secondary scheme for determining if a memory block is to be retired. The one or more processors 114 include a timer to prompt the processor(s) 114 to perform the background scan after a predetermined time period has expired. The timer may prompt the flash drive 102 to wake-up the processor(s) 114 if necessary.

At decision 802, the flash drive 102 determines if a predetermined time period for power-on has expired for the memory blocks. For example, the timer in the processor(s) 114 of the flash drive 102 calculates the duration that the memory blocks have been powered on. The flash drive 102 determines if the duration is greater than the predetermined time period. An example time period is twenty-four hours of power-on for the memory blocks in the flash drive 102. This time period is provided for explanatory purposes. However, the invention is not so limited. Any other time period may be included in another embodiment.

If no at decision 802 (e.g., time period has not expired), then the method 800 is at an end but may repeat as necessary.

However, if yes at decision 802 (e.g., time period has expired), then the method 800 moves to action 804.

At action 804, the flash drive performs the background scan operations of method 500 of FIG. 5. For instance, the flash drive 102 can perform the background scan of method 500 on every NAND gate in every page of every block in the flash media 108.

CONCLUSION

Aspects of the embodiments of the disclosure are thus described. Features of the embodiments may be implemented in a system by using software and/or hardware. For example, a system may include one or more processors that execute instructions of software to implement an aspect of the disclosure. A process may be performed by instructions with a processor.

When implemented in software, the elements of the embodiments are essentially the code segments or instructions to perform the necessary tasks. The program or code segments can be stored in a processor readable medium. The processor readable medium may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a flash or solid state disk or drive (SSD), or other type of storage device. The code segments or instructions may be remotely stored and downloaded in a data signal via computer networks such as the Internet, Intranet, etc. over a fiber optic medium, a radio frequency (RF) link, or other transmission medium for execution by a processor.

Two overall schemes are provided for separating the poorly functioning blocks (e.g., weak memory blocks with high BER and/or memory blocks with other problems) from normally functioning blocks. In a first scheme, after data relocation is finished, firmware remembers the old physical memory block. As soon as the system writes to the old physical memory block with new data, firmware issues a read again and receives back a count of error bits. If the returned error bits are still high (e.g., high bit error rate), then the system identifies the block as being weak and retires the block. In a second scheme, firmware tracks statistics for data relocates, block reads, activity timers, among other statistics. If some blocks have abnormal activities (e.g., too many data relocates, too many reads, etc.), then the system may identify the block as being weak and may retire the physical memory block.

Accordingly, the system can detect a weak physical memory block, relocate the weak physical memory block's data, and immediately retire the weak physical memory block during run-time. Continuous data relocation does not affect static wear-leveling of the physical memory blocks. Continuous relocation of blocks helps improve quality of service (QoS) performance.

While certain exemplary embodiments have been described and shown in the accompanying drawings, it is to be understood that such embodiments are merely illustrative of and not restrictive on the broad disclosure, and that the embodiments of the disclosure not be limited to the specific constructions and arrangements shown and described, since various other modifications may occur to those ordinarily skilled in the art. The embodiments of the disclosure should be construed according to the claims that follow below.

What is claimed is:

1. A method for retiring computer memory blocks in a memory apparatus, the method comprising:
   receiving a read request from a processor in a host computer;
   performing a read on a memory block in the memory apparatus that are block writeable;
   receiving a count of error bits for the memory block;
   determining whether the count of error bits is above an acceptability threshold for a bit error rate; and
   if the count of error bits is above the acceptability threshold for the bit error rate, then
      determining if the memory block is weak;
      relocating data stored in the memory block to another memory block;
      performing a post-relocate check on the memory block when the memory block is determined to not be weak; and
      retiring the memory block from the memory apparatus so that it is no longer utilized to store data based on the post-relocate check.

2. The method of claim 1, wherein
the read request is directed toward a page of the memory block in the memory apparatus.

3. The method of claim 1, wherein
the memory apparatus includes flash memory having one or more integrated circuits with electrically erasable programmable read only memory cells.

4. The method of claim 1, wherein
the count of error bits is included in an error bit code associated with the memory block in the memory apparatus.

5. The method of claim 1, wherein the post-relocate check comprises:
   calculating a number of data relocates have occurred from the memory block;
   determining if the number of relocates is above an acceptability threshold for data relocates; and
   if the number of relocates is above the acceptability threshold for data relocates, then
      retiring the memory block in the memory apparatus.

6. The method of claim 1, further comprising:
   calculating a number of reads that have occurred from the memory block;
   determining if the number of reads is above an acceptability threshold for reads; and
   if the number of reads is above the acceptability threshold for reads, then
      performing background scan operations to determine if the memory block is to be retired.

7. The method of claim 1, further comprising:
   calculating the duration that the memory block has been powered on;
   determining if the duration is greater than a predetermined time period;
   if the duration is greater than the predetermined time period, then
      performing background scan operations to determine if the memory block is to be retired.

8. The method of claim 1, wherein the retiring of the memory block comprises:
   moving a pointer to the memory block from a normal list to a retired list.

9. A non-transitory computer readable medium carrying one or more instructions for retiring memory blocks in a memory apparatus, wherein the one or more instructions, when executed by one or more processors, cause the one or more processors to perform steps of:
   receiving a read request from a processor in a host computer;
   performing a read on a memory block in the memory apparatus that are block writeable;
   receiving a count of error bits for the memory block;
   determining whether the count of error bits is above an acceptability threshold for a bit error rate; and
   if the count of error bits is above the acceptability threshold for the bit error rate, then
      determining if the memory block is weak,
      relocating data stored in the memory block to another memory block,
      performing a post-relocate check on the memory block when the memory block is determined to not be weak, and
      retiring the memory block from the memory apparatus so that it is no longer utilized to store data based on the post-relocate check.

10. The non-transitory computer readable medium of claim 9, wherein
the read request is directed toward a page of the memory block in the memory apparatus.

11. The non-transitory computer readable medium of claim 9, wherein
the memory apparatus includes flash memory having one or more integrated circuits with electrically erasable programmable read only memory cells.

12. The non-transitory computer readable medium of claim 9, wherein
the count of error bits is included in an error bit code associated with the memory block in the memory apparatus.

13. The non-transitory computer readable medium of claim 9, wherein the post-relocate check causes the one or more processors to perform steps of:
   calculating a number of data relocates have occurred from the memory block;
   determining if the number of relocates is above an acceptability threshold for data relocates; and
   if the number of relocates is above the acceptability threshold for data relocates, then
      retiring the memory block in the memory apparatus.

14. The non-transitory computer readable medium of claim 9, wherein the one or more instructions cause the one or more processors to perform steps of:
   calculating a number of reads that have occurred from the memory block;
   determining if the number of reads is above an acceptability threshold for reads; and
   if the number of reads is above the acceptability threshold for reads, then
      performing background scan operations to determine if the memory block is to be retired.

15. The non-transitory computer readable medium of claim 9, wherein the one or more instructions cause the one or more processors to perform steps of:
   calculating the duration that the memory block has been powered on;
   determining if the duration is greater than a predetermined time period;

if the duration is greater than the predetermined time period, then
performing background scan operations to determine if the memory block is to be retired.

16. The non-transitory computer readable medium of claim 9, wherein the retiring of the memory block comprises:
moving a pointer to the memory block from a normal list to a retired list.

* * * * *